(12) United States Patent  (10) Patent No.: US 7,560,198 B2
Jang et al.  (45) Date of Patent: Jul. 14, 2009

(54) PHOTO-MASK HAVING EXPOSURE BLOCKING REGION AND METHODS OF DESIGNING AND FABRICATING THE SAME

(75) Inventors: Il-Yong Jang, Yongin-si (KR);
Seong-Woon Choi, Suwon-si (KR);
Seong-Yong Moon, Yongin-si (KR);
Jeong-Yun Lee, Yongin-si (KR);
Sung-Hoon Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 704 days.

(21) Appl. No.: 11/145,985

(22) Filed: Jun. 7, 2005

(65) Prior Publication Data

US 2006/0051684 A1   Mar. 9, 2006

(30) Foreign Application Priority Data

Jun. 7, 2004  (KR)  ............... 10-2004-0041440

(51) Int. Cl.
*G03F 1/00*  (2006.01)
(52) U.S. Cl. ......................................................... 430/5
(58) Field of Classification Search .................. 430/5, 430/394; 716/19, 20, 21
See application file for complete search history.

(56) References Cited

U.S. PATENT DOCUMENTS 5,723,234 A    3/1998  Yokoyama et al.
6,566,017 B1 * 5/2003  Chen et al. .................... 430/5
6,617,083 B2 * 9/2003  Usui et al. ..................... 430/5

FOREIGN PATENT DOCUMENTS

| JP | 2001-235851 | 8/2001 |
| JP | 2003-057805 | 2/2003 |
| KR | 100172561 B1 | 10/1998 |
| KR | 1020020068419 A | 8/2002 |

* cited by examiner

*Primary Examiner*—Stephen Rosasco
(74) *Attorney, Agent, or Firm*—Volentine & Whitt, PLLC

(57) ABSTRACT

A photo-mask has a main mask pattern in a main region, a density correcting pattern in a peripheral region, and an exposure blocking pattern interposed between the main mask pattern and density correcting pattern. The exposure blocking pattern is configured to prevent the density correcting pattern from being transcribed to a wafer. The photo-mask is made by providing mask substrate on which a mask layer and a photoresist layer are disposed, providing design data that specifies at least the main mask pattern, and using the design data to derive exposure data that controls the exposure of the photoresist layer. The exposure data includes information that specifies the exposure blocking pattern, the portion of the peripheral region to be occupied by the density correcting pattern, and the pattern density of that portion of the peripheral region to be occupied by the density correcting pattern.

37 Claims, 19 Drawing Sheets

<Measuring after etching>

<Measuring after etching>

<Measuring after developing>

<Measuring after developing>

PHOTO-MASK HAVING EXPOSURE BLOCKING REGION AND METHODS OF DESIGNING AND FABRICATING THE SAME

BACKGROUND OF THE INVENTION

1. Field of the Invention

The present invention relates to a photo-mask used for fabricating a semiconductor integrated circuit and to a method of fabricating the same.

2. Description of the Related Art

The fabricating of a semiconductor integrated circuit includes a photolithography process of transcribing the image of a circuit pattern from a photo-mask to a photoresist (PR) layer on a wafer. The wafer photoresist pattern (WPR pattern) formed by the photolithography, process is used as a mask for etching material lying under the WPR pattern. On the one hand, the line width of the WPR pattern is the technical variable that most determines the degree to which the final semiconductor circuit is integrated. On the other hand, the degree of integration of the circuit is a main technical factor affecting the value of the semiconductor product. Therefore, various research is aimed at minimizing the line width of the WPR pattern.

Moreover, the uniformity of the line width of the WPR pattern significantly affects the product yield; therefore, reducing the line width of the WPR without maintaining uniformity in the line width has no advantages. Accordingly, various techniques have been suggested for improving the uniformity of the line width of the WPR pattern, such as techniques aimed at controlling conditions of the photolithography process.

FIG. 1 is a flowchart illustrating typical processes in the fabricating of a photo-mask. Referring to FIG. 1, a circuit pattern of a semiconductor product is designed using a computer program (such as a CAD or OPUS program). The design of the circuit pattern is stored in a predetermined memory as electronic data D1. Then, an exposure process (S2) is performed in which an electronic beam or a laser irradiates predetermined regions of a photoresist film extending over a chrome layer on a quartz substrate. The regions irradiated in the exposure process (S2) are determined by exposure data D8 extracted from the design data. The exposed photoresist film is then developed (S3). The development process (S3) removes select portions of the photoresist film, such as those which were irradiated, to thereby form a photoresist pattern. The photoresist pattern exposes the underlying chrome film. The exposed chrome film is then plasma dry-etched using the photoresist pattern as a mask to form a main mask pattern that corresponds to the circuit pattern and, in turn, exposes the quartz substrate (S40).

FIGS. 2A and 2B are a plan view and a sectional view, respectively, of a photo-mask from which the photoresist pattern has been removed. The photo-mask 10 includes a main region 20 typically defined at the center of the photo-mask, and an auxiliary region 30 extending around the main region. The main mask pattern to be transcribed to the wafer, and corresponding to a circuit pattern to be formed on the wafer, is located in the main region 20. An auxiliary pattern, such as an alignment key for aligning the photo-mask in the exposure apparatus, is located in the auxiliary region 30.

The main mask (chrome) pattern may have different line widths due to a fogging effect or a loading effect caused by differences in the density of the photoresist pattern at various regions of the photo-mask (hereinafter referred to as differences in density "in accordance with position"). An experiment performed to uncover the influences that the pattern density of the photoresist has on the line width of the underlying pattern revealed that the fogging effect and the loading effect cause fluctuations in the line width of the underlying pattern by factors of 4.4% and 2.9%, respectively.

It is not possible to remove the root cause of the fogging and loading effects because such effects are physical phenomena caused by differences in the pattern density. It is only possible to minimize the effects by reducing the differences in the pattern density. The method commonly used for reducing the differences in the pattern density entails forming around the main region 20 a density correcting pattern 40 (FIGS. 3A and 3B) having the same pattern density as the pattern density of the main region 20. Although the density correcting pattern 40 makes it possible to effectively prevent the fogging and loading effects from manifesting themselves in the process of forming the main mask pattern, if the density correcting pattern 40 were transcribed to the WPR film, the resulting products would be severely defective.

U.S. Pat. No. 6,566,017 (Chen et al.) discloses a technique of forming an opaque layer on the photo-mask to prevent the density correcting pattern from being transcribed to a wafer. That is, as illustrated in FIG. 1, a deposition process (S5) in which the photo-mask is covered with an opaque layer 50 (FIGS. 4A and 4B) is performed after the etching process (S4). Then, the opaque film 50 is patterned (S6) to form an exposure blocking pattern 55 (FIGS. 5A and 5B) having apertures that expose the main region 20 and the auxiliary region 30, while the density correcting pattern 40 remains covered. The positions of the apertures are determined by extracting opening region data D9 from the design data D1. The photo-mask in which the exposure blocking pattern 55 is formed is delivered (S7) to a customer after undergoing some additional processes.

On the one hand, the exposure blocking pattern 55 prevents the density correcting pattern 40 from being transcribed to the WPR film. However, the additional deposition and patterning processes required to form the exposure blocking pattern 55 increase the cost of fabricating the photo-mask.

SUMMARY OF THE INVENTION

One object of the present invention is to provide a photo-mask having a mask pattern whose line width has a high degree of uniformity.

Another object of the present invention is to provide an economical method of fabricating a photo-mask having a mask pattern whose line width has a high degree of uniformity.

Likewise, another object of the present invention is to provide a method of generating data used to control the fabricating of a photo-mask, such that the costs of fabricating the photo-mask will be relatively low and the resulting photo-mask will have a mask pattern whose line width has a high degree of uniformity.

According to one aspect of the present invention, exposure data for controlling an exposure process in the fabricating of the photo-mask is derived, at least in part from design data of the photo-mask, to specify a main mask pattern of the photo-mask, a density correcting pattern of the photo-mask, and an exposure blocking pattern of the photo-mask. The density correcting pattern is a pattern formed to prevent certain factors from affecting the uniformity of the line width of the main mask pattern. The exposure blocking pattern prevents the density correcting pattern from being transcribed to a wafer during a given photolithography process.

The exposure data is derived by generating basic exposure data that specifies coordinates for forming the main mask pattern and an auxiliary pattern, and auxiliary exposure data that specifies coordinates for forming the density correcting pattern. Then, the basic exposure data and the auxiliary exposure data are combined to generate exposure coordinate data used in the control of the exposure process.

Opening region data, that specifies the region of the photo-mask from which the density correcting pattern is to be excluded, is extracted from the design data. Also, density correcting pad data is produced. The density correcting data specifies a density correcting pad over a density correcting pad region corresponding to the entire surface of the photo-mask. Then, the opening region data and the density correcting pad data are logically processed to generate the auxiliary exposure data.

Data of the coordinates of a main opening region constituted by the main region and the exposure blocking, and data of the coordinates of an auxiliary opening region including the auxiliary region, are extracted from the design data. The opening region data is formulated by combining the data of the coordinates of the main opening region and the data of the coordinates of the auxiliary opening region using an OR operation. Preferably, the opening region data specifies the width of the exposure blocking region as about 0.1 to 50 mm.

Preferably, the density correcting pad region is specified to have the same pattern density as the pattern density of the main region. Alternatively, the density correcting pad data is generated using feedback, obtained experimentally or theoretically, to specify variations in the pattern density of the density correcting pad region (differences in accordance with position).

According to another aspect of the present invention, the fabricating of the photo-mask is carried out by providing a photo-mask substrate on which a mask layer and a photoresist layer are disposed, and performing an exposure process in which the photoresist layer is exposed as controlled in accordance with the exposure data. Then, the photoresist layer is developed such that the photoresist layer is patterned. Next, the mask layer is etched using the patterned photoresist layer as an etch mask to form the main mask pattern, the density correcting pattern, and the exposure blocking pattern all at once.

The exposure process is performed using an electron beam or a laser such that the photoresist is exposed locally. In this case, the exposure condition data specifies a physical property of the electron beam or the laser, e.g., the dose, as a function of position.

According to another aspect of the present invention, there is provided a photo-mask having a photo-mask substrate, and one layer comprising a main mask pattern, a density correcting pattern and an exposure blocking region. The photo-mask substrate is transparent and has a main region at which the main mask pattern is disposed, and a peripheral region at which the density correcting pattern and an auxiliary pattern are disposed. The exposure blocking pattern is disposed in an exposure blocking region. The exposure blocking region extends from the main mask pattern to the density correcting pattern, and has a pattern density sufficient to prevent the image of the density correcting pattern from being transmitted by the photo-mask. The exposure blocking pattern, the main mask pattern and the density correcting pattern are preferably made of the same material(s) and have the same thickness.

Preferably, the pattern density of the main region is 30 to 70%, and the pattern density of the peripheral region is 10 to 90%. However, the pattern density of that portion of the peripheral region occupied by the density correcting pattern is preferably equal to the pattern density of the main region.

Also, the peripheral region may comprise modified density correcting regions adjacent to the exposure blocking region. In this case, the density correcting pattern comprises modified density correcting patterns disposed in the modified density correcting regions, respectively. These modified density correcting regions have pattern densities that differ in accordance with their location. Moreover, the pattern densities of the modified density correcting regions differ from the pattern density of the main region by about 10%.

BRIEF DESCRIPTION OF THE DRAWINGS

These and other objects, features and advantages of the present invention will become better understood form the detailed description of the preferred embodiments thereof that follows as made with reference to the accompanying drawings. In the drawings.

DETAILED DESCRIPTION OF THE PREFERRED EMBODIMENTS

Figure 6:
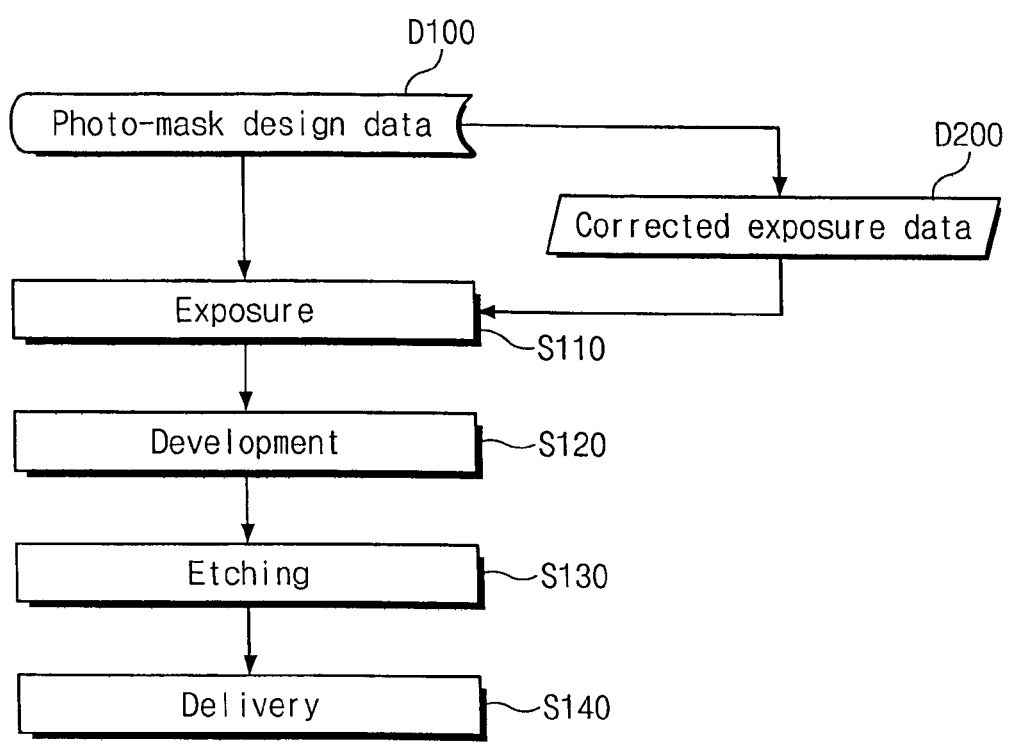
FIG. 6 is a flowchart of a general method of fabricating a photo-mask according to the present invention.

Referring to FIG. 6, a circuit pattern of a semiconductor device is designed using a computer program such as a CAD or OPUS program. The circuit pattern is stored in a memory as electronic data D100. The electronic data D100 is inputted to computer in which predetermined data processing programs are loaded. The design data is processed by the computer to derive exposure data for controlling an exposure process (S110) to be performed by the apparatus used for making the photo-mask.

According to the present invention, the exposure data is processed by a data processing program so as to generate corrected exposure data D200 that includes specifications of a density correcting pattern that will serve to minimize variations in the line width of the main mask pattern. Also, the corrected exposure data D200 specifies an exposure blocking pattern that will prevent the density correcting pattern from being transcribed to a wafer photoresist (WPR) film. The generating of the corrected exposure data D200 will be described in more detail later on with reference to FIGS. 7 to 9.

An exposure apparatus performs the exposure process (S110). In this process (S110), a predetermined region of a photoresist film formed on a photomask substrate is irradiated using an electron beam or a laser. A quartz substrate is commonly used as the photo-mask substrate. The region of the photoresist film irradiated in the exposure process (S110) is determined by the corrected exposure data D200.

The exposed photoresist film then undergoes a development process (S120) to form a photoresist pattern that exposes a film situated under the photoresist. The film may comprise at least one layer of material selected from a group consisting of Cr, MoSi, an IV-transition metal nitride, a V-transition metal nitride, a VI-transition metal nitride, and silicon nitride. Subsequently, the exposed film is etched (S130) using the photoresist pattern as an etching mask so that information on the shape of the circuit pattern, provided by the design data D100, is transcribed onto the film to form a main mask pattern. That is, the main mask pattern has a shape corresponding to the circuit pattern represented by the design data D100. The main mask pattern exposes the top surface of the photo-mask substrate.

The photoresist pattern is removed after the etching process. Then, the photo-mask is washed. The photo-mask formed by such a process is subsequently inspected to determine whether a value of critical dimensions of the mask pattern is smaller than a predetermined value. A photo-mask that passes such an inspection is delivered (S140) as a final product.

According to embodiments of the present invention, the corrected exposure data D200 includes at least coordinate data (data on the relative position) of the density correcting pattern and coordinate data of the exposure blocking pattern. The density correcting pattern will offset the effects that differences in the pattern density of the photoresist pattern would otherwise have on the line width of the mask pattern formed using the photoresist pattern as an etch mask. "Pattern density" refers to the percentage of an arbitrary region that is occupied by a pattern, i.e., the total area of the pattern within such region with respect to the entire area of the region. The exposure blocking pattern will prevent the density correcting pattern from being transcribed to a WPR film.

Figure 7:
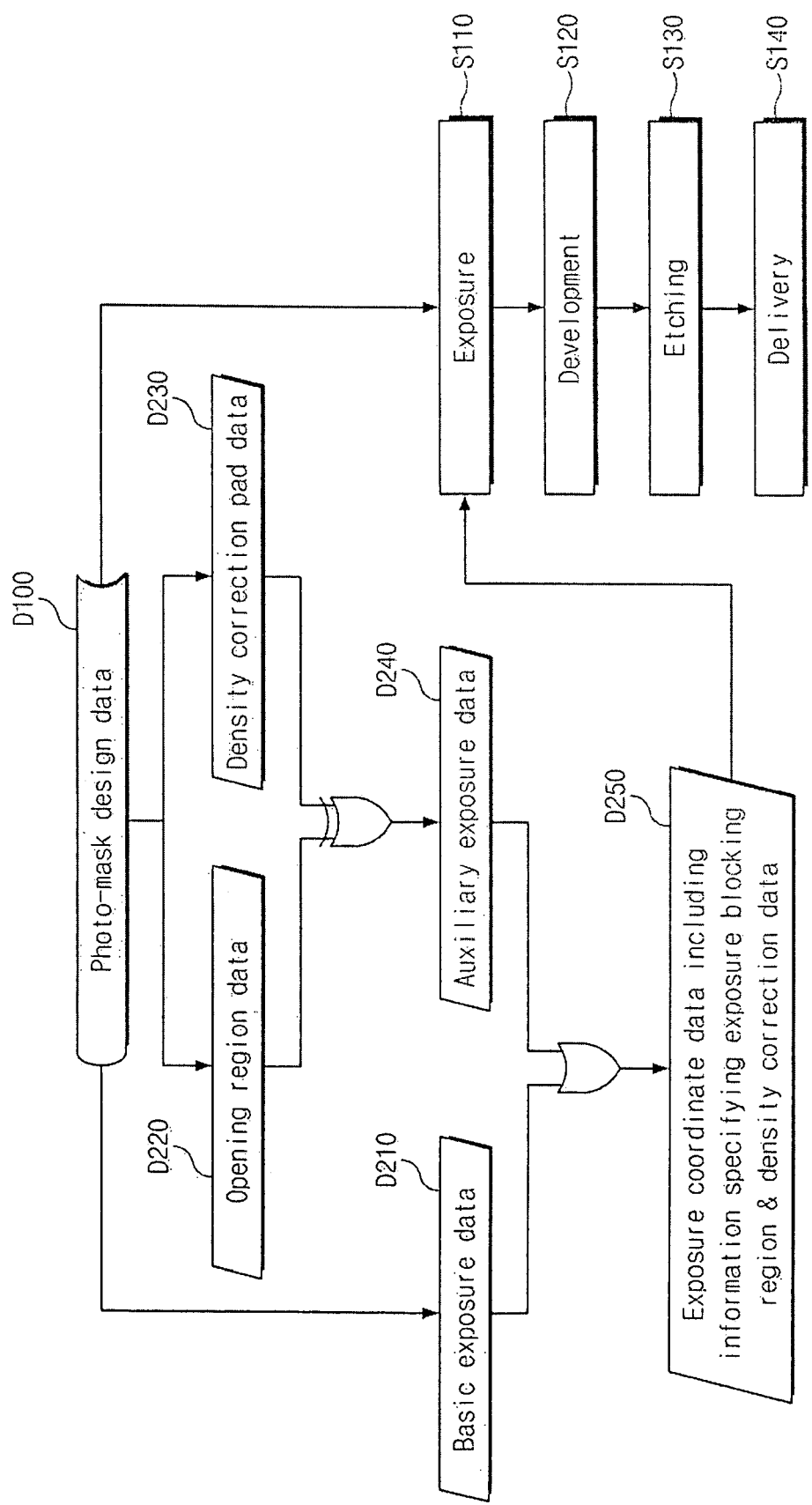
FIG. 7 is a flowchart of one embodiment of the method of fabricating a photo-mask according to the present invention.
Figure 10:
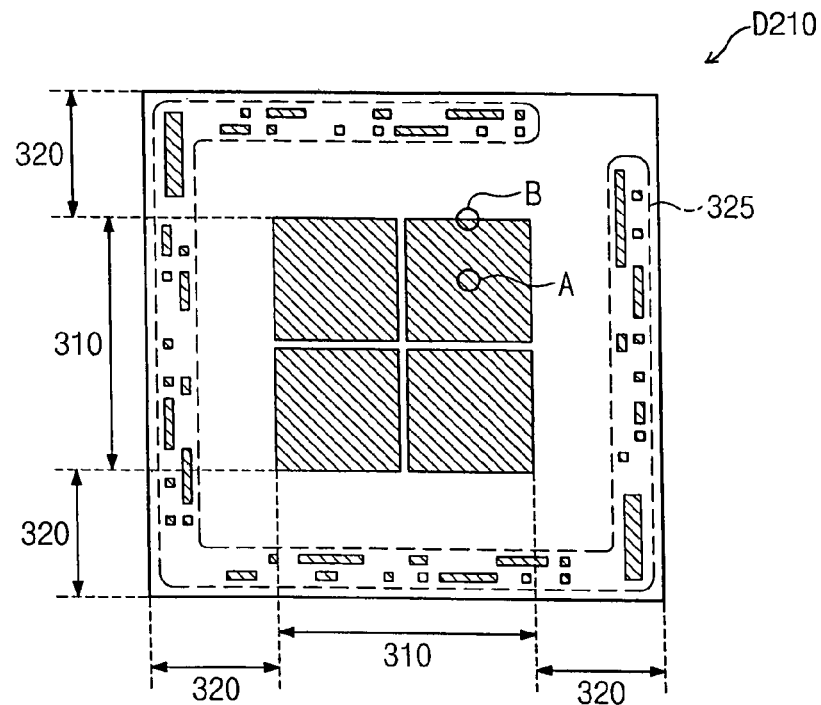
FIG. 10 illustrates the virtual information provided by basic exposure data according to the embodiment of FIG. 7.
Figure 11:
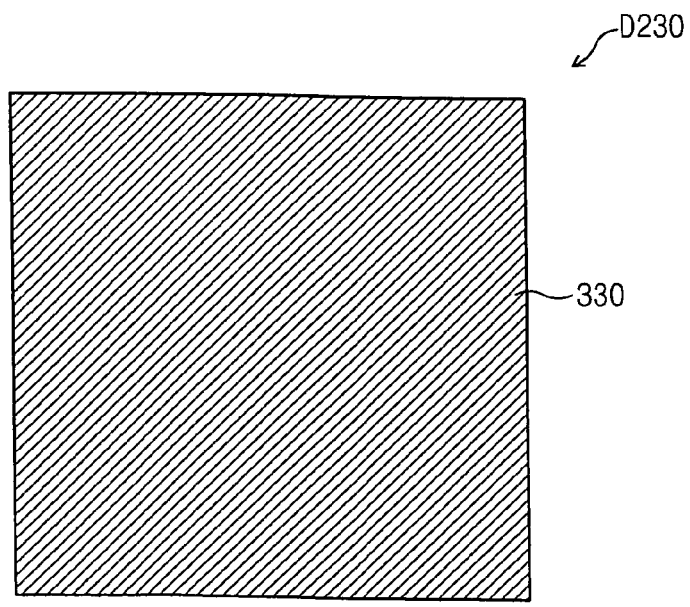
FIG. 11 illustrates a density pad correcting pattern specified by density correction pad data according to the embodiment of FIG. 7.
Figure 15:
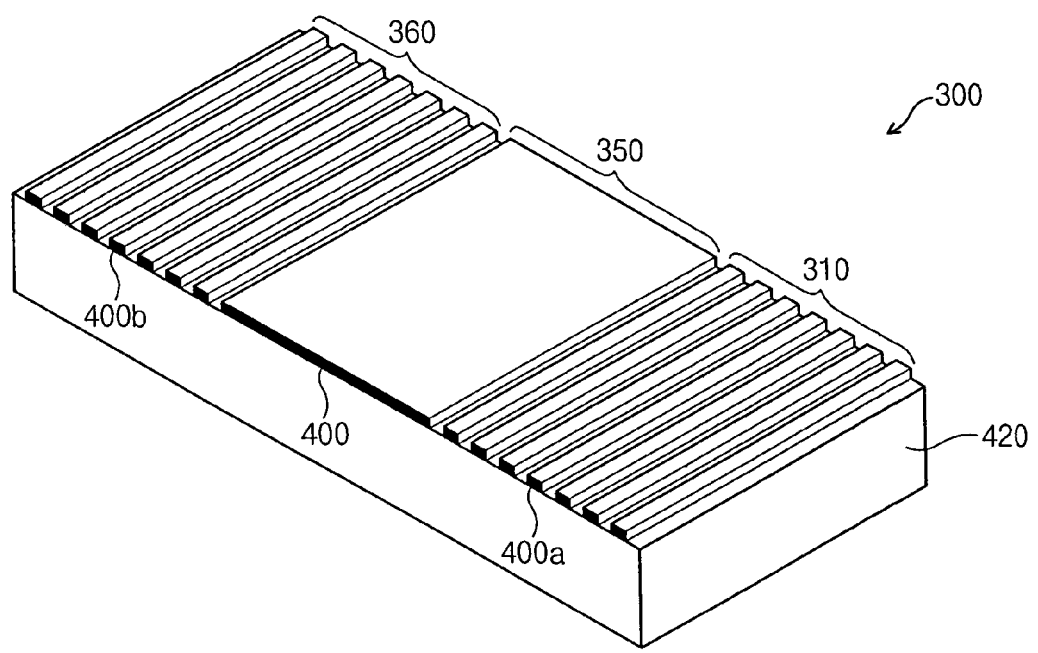
FIG. 15 is a perspective view of part of the photo-mask located along line I-I' in FIG. 14, according to the present invention.

FIG. 7 illustrates a process of creating the corrected exposure data D200 from the design data D100. FIG. 10 illustrates the various regions of the photo-mask specified by the design data. FIGS. 11 to 14 illustrate other items specified by the design data. The features illustrated in FIGS. 10 to 14 are represented by virtual information output by the data processing programs to a user interface such as a monitor. FIG. 15 is a perspective view of a photo-mask fabricated according to the present invention.

The design data D100 includes the specifications of a main region 310 at the center of the photo-mask 300 and of a peripheral region 320 surrounding the main region 310. The peripheral region 320 may include an auxiliary region 325 in which an auxiliary pattern(s), such as an alignment key used for aligning the photo-mask in exposure apparatus of photolithography equipment, is located. The main mask pattern (400a of FIG. 15), i.e., the pattern to be transcribed to the wafer, is located in the main region 310. In general, the pattern density of the main region 310 is 30 to 70%. On the other hand, excluding the auxiliary region 325, the pattern density of the peripheral region 320 is 0%. The line width of the main mask pattern 400a tends to vary among the central (A) and outer peripheral edge (B) portions of the main region 310 due to the fogging and loading effects.

Referring to FIG. 7, basic exposure data D210, opening region data D220, and density correction pad data D230 are prepared from the design data D100.

The basic exposure data D210 specifies the relative positions of the features of the main mask and auxiliary patterns. More specifically, the basic exposure data D210 includes information on the locations irradiated with an electron beam in the exposure process to form the photoresist pattern that is used, in turn, to form the main mask and auxiliary patterns. As a result, the basic exposure data D210 contains the information illustrated in FIG. 10.

The density correction pad data D230 specifies a density correcting pad region 330 (FIG. 11) that has the same pattern density as the main region 310 and corresponds to the entire surface of the photo-mask 300. Strictly speaking, the density correction pad data D230 specifies the relative positions of the features of a density correcting pattern in the density correcting pad region 330.

Figure 12:
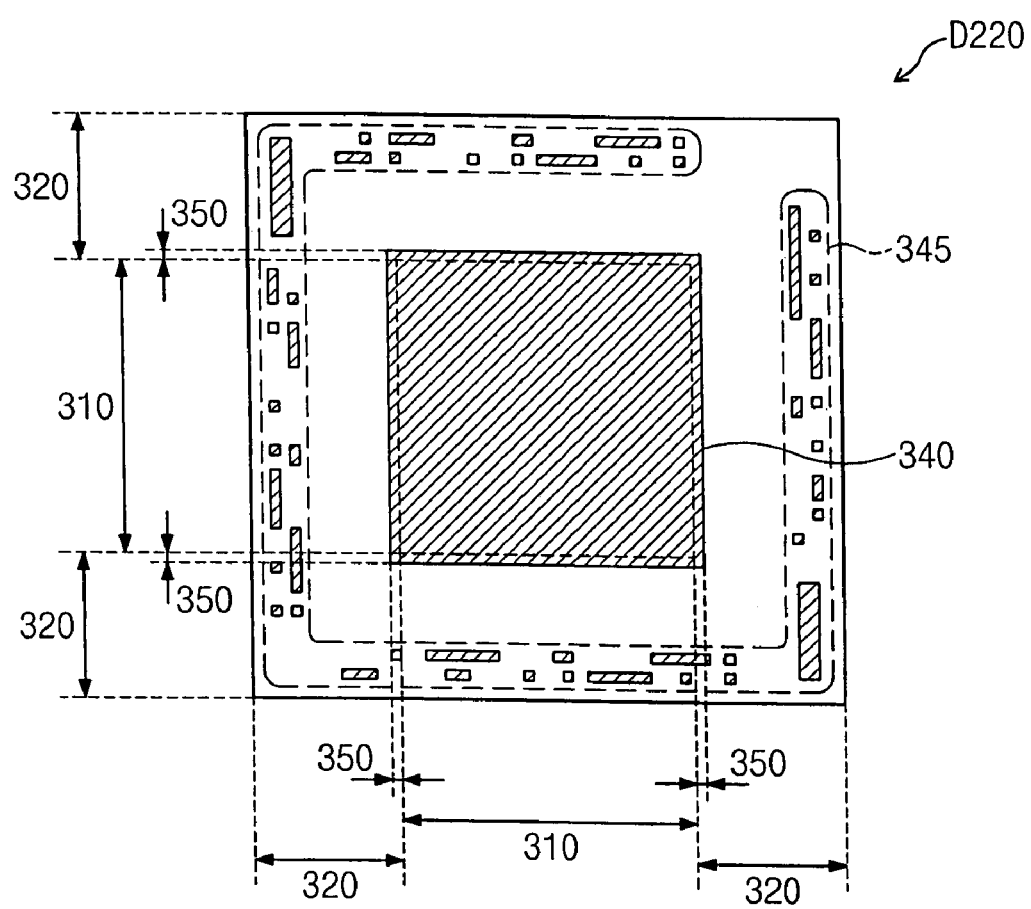
FIG. 12 illustrates opening regions specified by opening region data according to an embodiment of the present invention.
Figure 13:
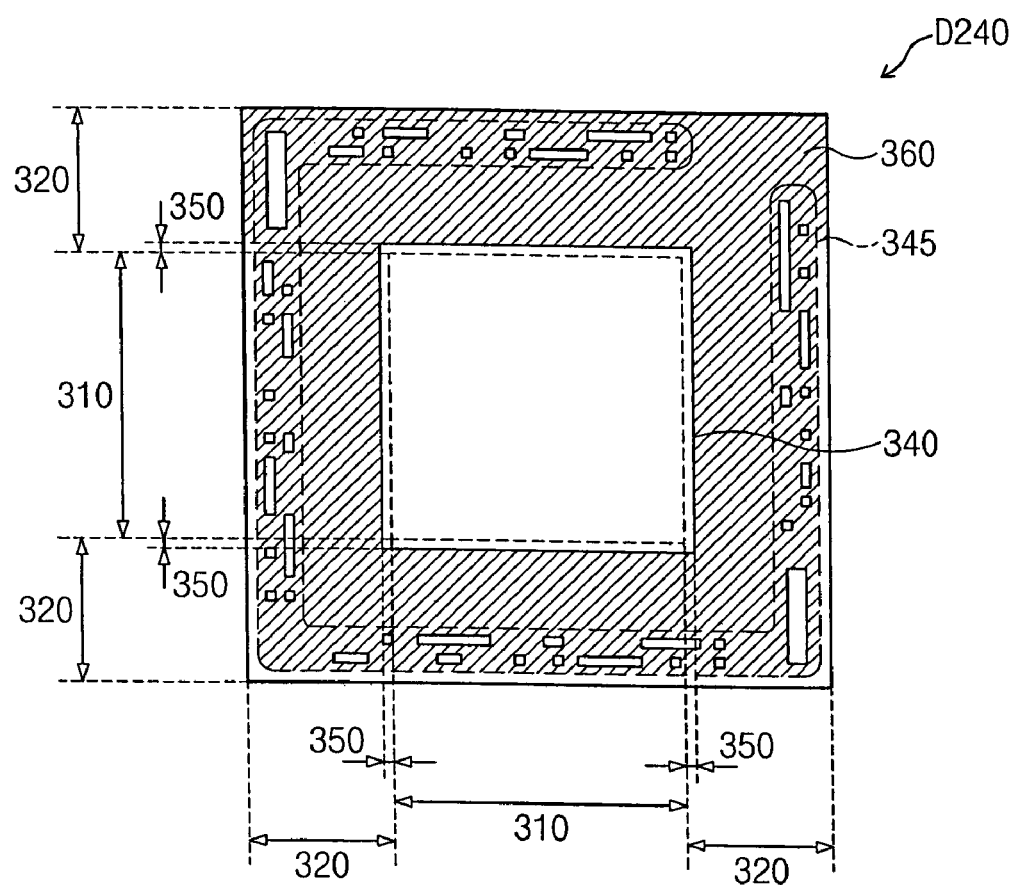
FIG. 13 illustrates the virtual information provided by auxiliary exposure data according to the embodiment of FIG. 7.
Figure 14:
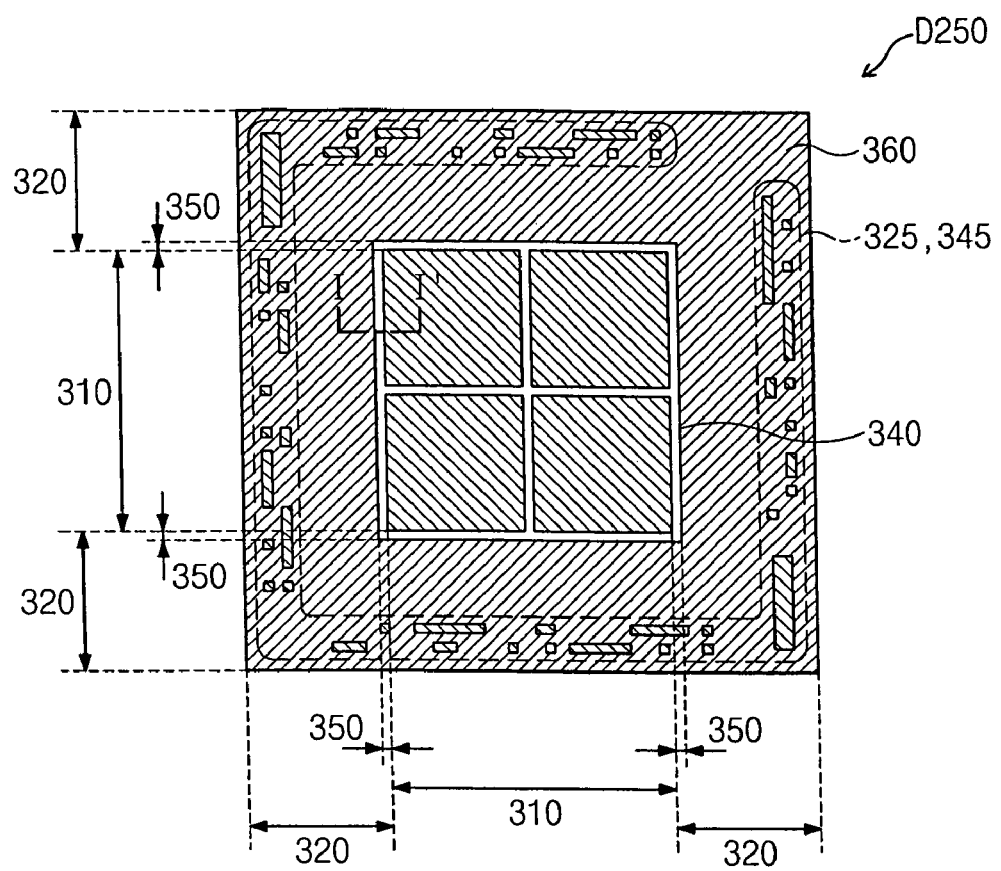
FIG. 14 is a plan view of an embodiment of a photo-mask according to the present invention fabricated from exposure coordinate data generated according to the method of FIG. 7.

The opening region data D220 specifies a main opening region 340 and an auxiliary opening region 345 (refer to FIG. 12). The main opening region 340 includes the main region 310 and an exposure blocking region 350 that surrounds the main region 310. The width of the exposure blocking region 350 is determined considering the process (alignment) margin of a typical photolithography process and is preferably 3.5 to 4.5 mm. The width of the exposure blocking region 350 may be within a range of 0.1 to 50 mm. The auxiliary opening region 345 includes the auxiliary region 325 and, preferably, only the locations of the features of the pattern(s) in the auxiliary region 325.

Still referring to FIG. 7, auxiliary exposure data D240 is prepared from the opening region data D220 and the density correction pad data D230. The auxiliary exposure data D240 specifies a density correcting pattern within a density correcting region 360 (refer to FIG. 13). The auxiliary exposure data D240 may be prepared by combining the opening region data D220 and the density correction pad data D230 using an exclusive OR operation. The density correcting region 360 corresponds to the region that is not specified by the opening region data D220 because the density correcting pad region 330 (FIG. 11) encompasses the entire surface of the photo-mask 300. That is, the density correcting region 360 encompasses the entire surface of the photo-mask 300 excluding the main opening region 340 and the auxiliary opening region 345. Thus, the density correcting region 360 encompasses all of the peripheral region 320 except the auxiliary region 325 and the exposure blocking region 350.

Finally, exposure coordinate data D250 is prepared from the basic exposure data D210 and the auxiliary exposure data D240. The exposure coordinate data D250 specifies the locations of the regions of the photoresist film to be irradiated with an electron beam in the exposure process (S110). The exposure coordinate data D250 may be prepared by combining the basic exposure data D210 and the auxiliary exposure data D240 using an OR operation. As a result, the exposure coordinate data D250 specifies the relative positions of the features of the main mask pattern 400a in the main region 310, of the auxiliary pattern(s) in the auxiliary region 325, and of the density correcting pattern 330 in the density correcting region 360 (refer to FIG. 14). Also, the exposure coordinate data D250 specifies the exposure blocking region 350 that is not irradiated in the exposure process S110.

Note, according to the present invention, a portion of the film underlying the photoresist pattern remains in the exposure blocking region 350 after the etching process (S130). The portion of the film that remains in the exposure blocking region 350 constitutes an exposure blocking pattern 400 (refer to FIG. 15) that prevents the density correcting pattern 400b from being transcribed to the WPR film in the wafer exposure process. The exposure blocking region 350 is completely occupied by the film constituting the exposure blocking pattern 400. That is, the pattern density of the exposure blocking region 350 is 100%. On the other hand, the regions 310 and 325 have a smaller pattern density than the exposure blocking region 350.

Alternatively, a pattern made up of features so minute that they are not transcribed to the WPR in the wafer exposure process may be formed in the exposure blocking region 350. That is, the pattern density of the exposure blocking region 350 may be less than 100%. In this case, the minute pattern is preferably configured such that the exposure blocking region 350 has the same pattern density as the main region 310.

Also, according to the present invention, the pattern density of the density correcting region 360 is equal to the pattern density of the main region 310 as described above. Therefore, it is possible to minimize technical problems caused by the variations in the pattern density of the photoresist pattern, which problems would otherwise manifest themselves in the etching process (S130).

Figure 1:
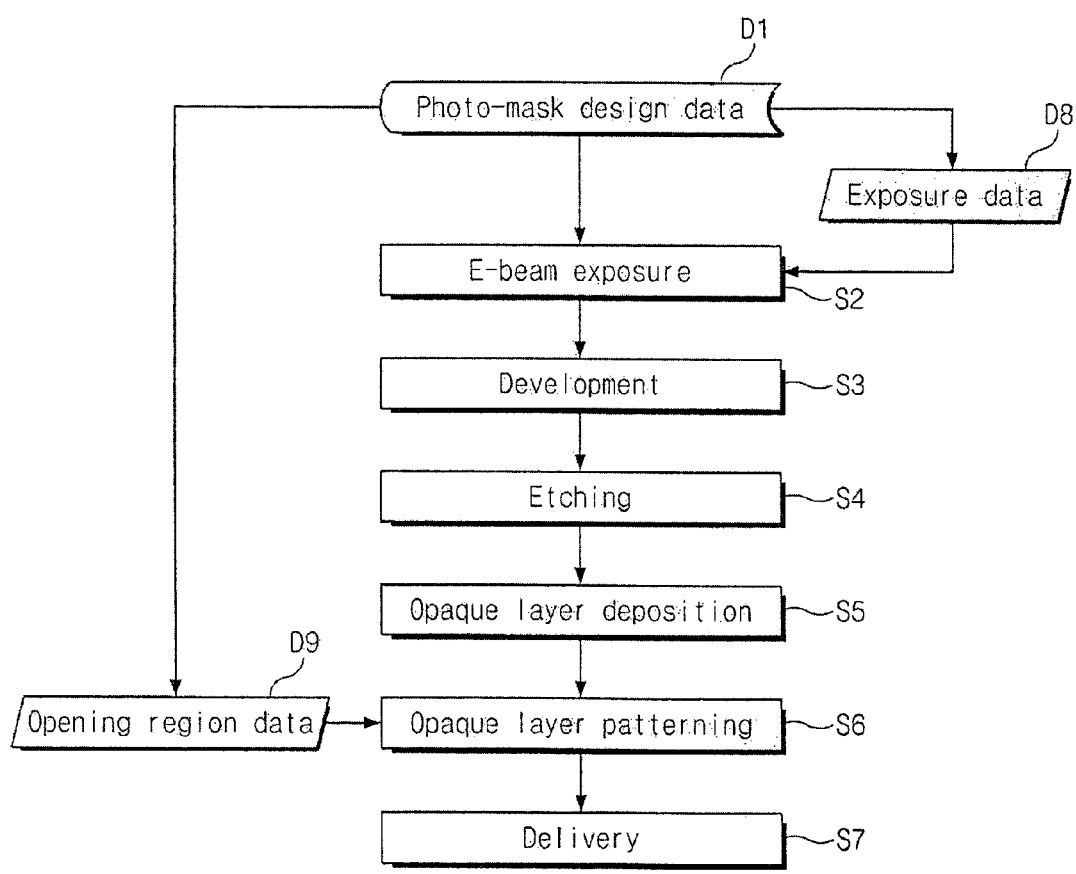
FIG. 1 is a flowchart of a conventional method of fabricating a photo-mask.
Figure 2A:
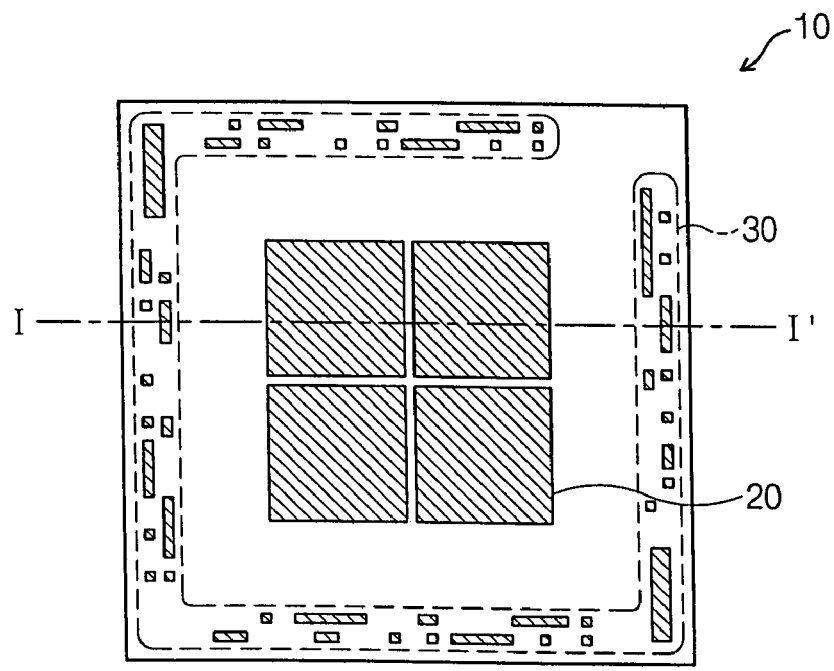
FIGS. 2A, 3A, 4A and 5A are plan views of a photo-mask substrate, illustrating a conventional method of fabricating a photo-mask.
Figure 2B:
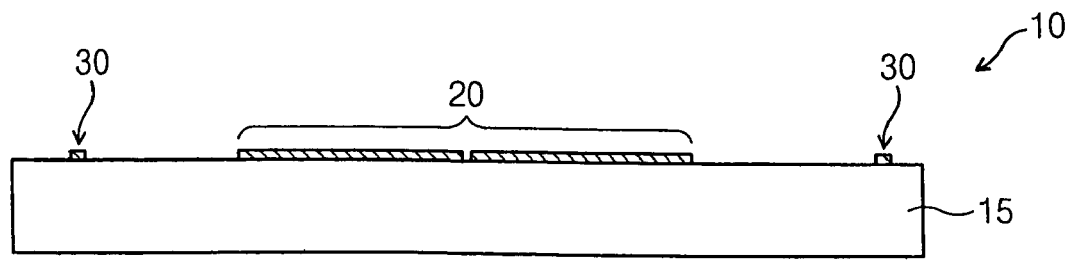
FIGS. 2B, 3B, 4B and 5B are sectional views of the photo-mask substrate, illustrating the conventional method of fabricating the photo-mask.
Figure 3A:
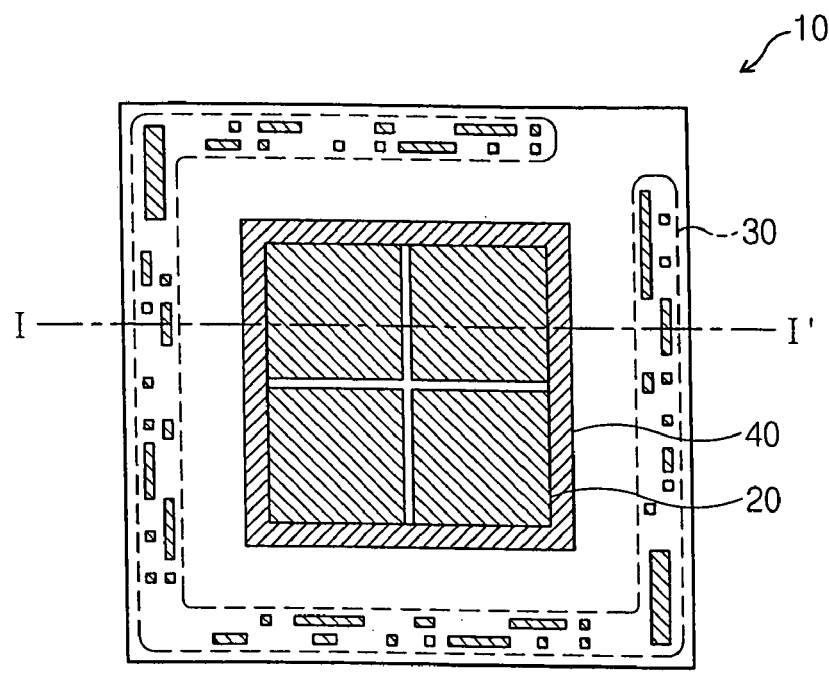
Figure 3B:
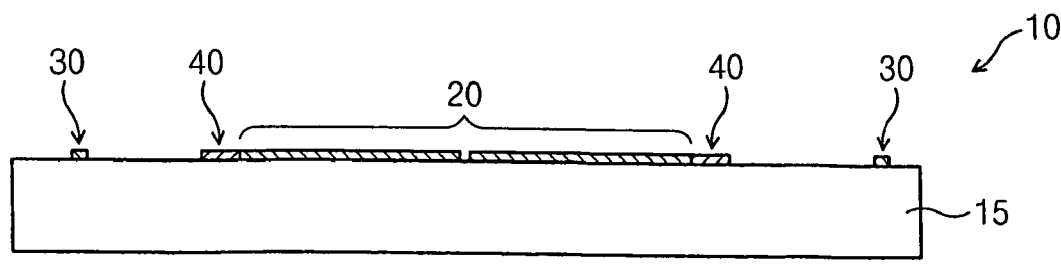
Figure 4A:
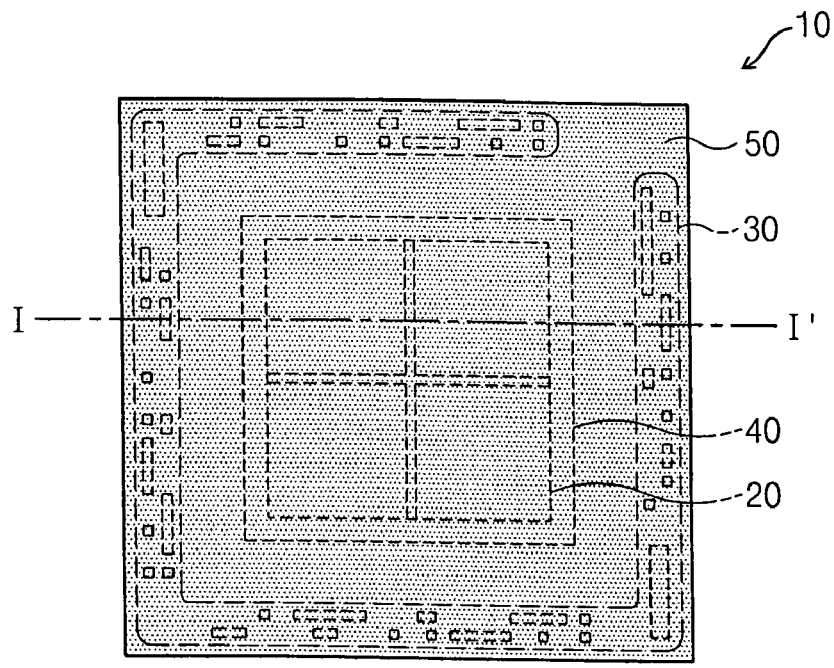
Figure 4B:
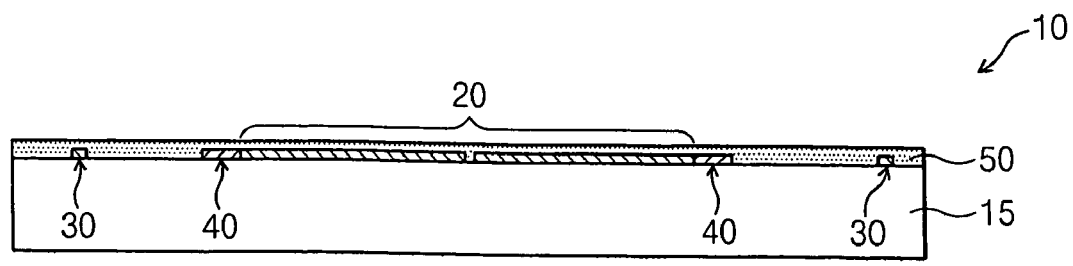
Figure 5A:
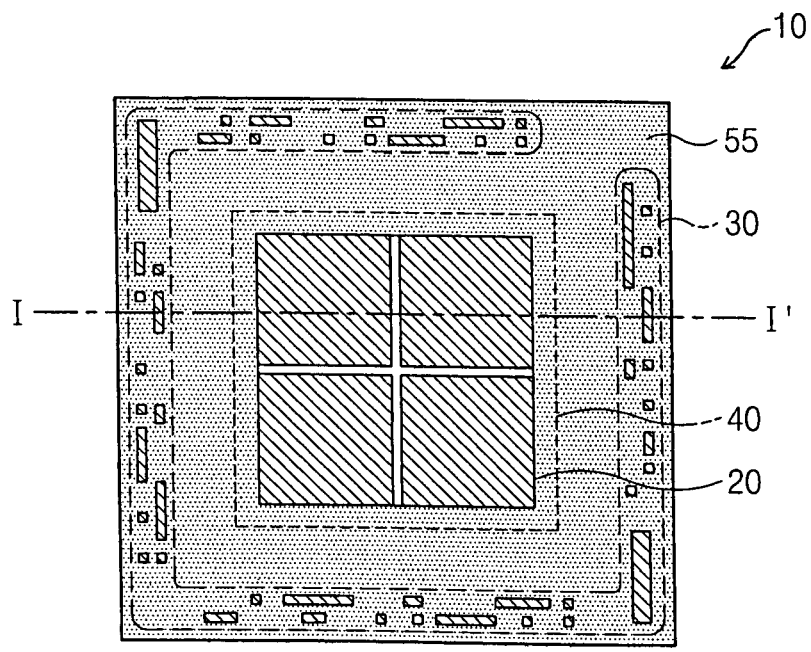
Figure 5B:
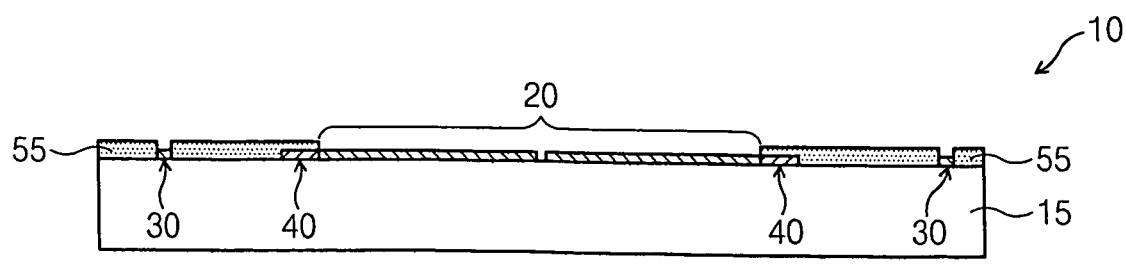
Figure 20A:
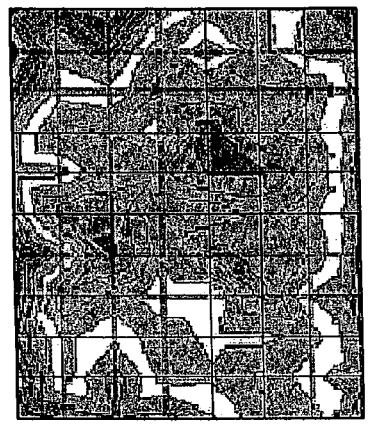
FIGS. 20A and 20B are data maps of line widths of a photo-mask that does not have a density correcting pattern.
Figure 20B:
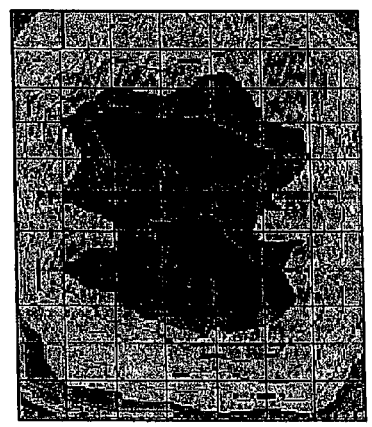
Figure 20C:
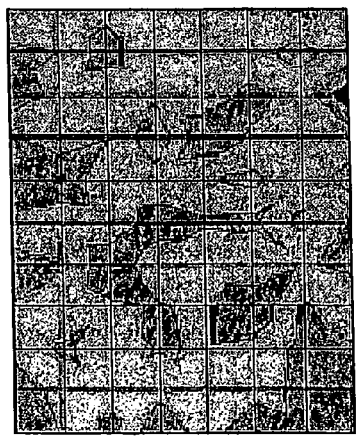
FIGS. 20C and 20D are data maps of line widths of a photo-mask having a density correcting pattern according to the present invention.
Figure 20D:
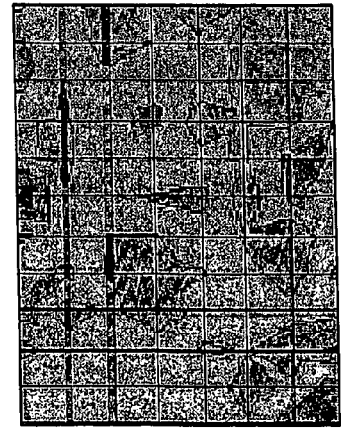

FIGS. 20A and 20B are data maps of measurements of the line width of a photo-mask fabricated using only data corresponding to the basic exposure data D210 (D8 in FIG. 1) to control the exposure process. That is, FIGS. 20A and 20B illustrate results obtained by performing the prior art method of FIG. 1. FIGS. 20C and 20D are data maps of measurements of the line width of a photo-mask fabricated according to the present invention, i.e., using the exposure coordinate data D250 to control the exposure process. FIGS. 20A and 20C illustrate measurements of the line widths of the photoresist patterns formed in the main region after the development process (S3/S120). FIGS. 20B and 20D illustrate measurements of the line widths of the mask patterns in the same region, i.e., after the etching process (S4/S130).

The contour lines in these data maps connect locations where the same line widths were revealed. The data maps of the results obtained by performing the method of the present invention have fewer contour lines than those obtained by performing the conventional method. Therefore, these results confirm that the method of the present invention provides higher etching uniformity than the conventional method.

The improvements offered by the present invention can also be confirmed by the range and the standard deviation (3σ) that represent the uniformity in the line width of the photo-mask. The range and 3σ of results obtained from the photo-mask fabricated by the conventional method were 29.22 nm and 16.43 nm, respectively. On the other hand, the range and 3σ of results obtained from the photo-mask fabricated according to the present invention were 18 nm and 12 nm, respectively. Such results confirm that the method of the present invention is a significant improvement over the conventional method.

Figure 16:
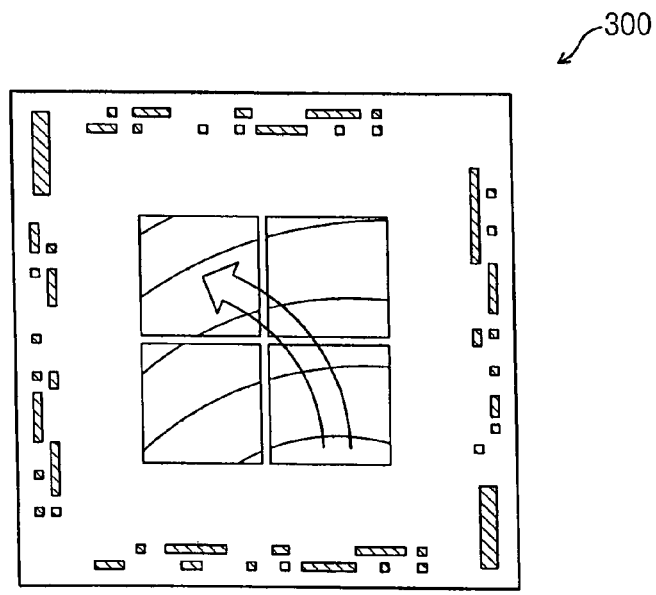
FIG. 16 is a data map of the line width of the main mask pattern of a photo-mask in accordance with position.

As described above, the non-uniformity in the line width of the main mask pattern is mainly caused by differences in the pattern density of the photoresist pattern. However, the line width of the main mask pattern may vary due to other unknown factors. In this respect, an inspection performed after the etching process (S130) may still reveal variations in the line width of the main mask pattern. FIG. 16 illustrates such a case in which the line width varies in accordance with position.

Figure 8:
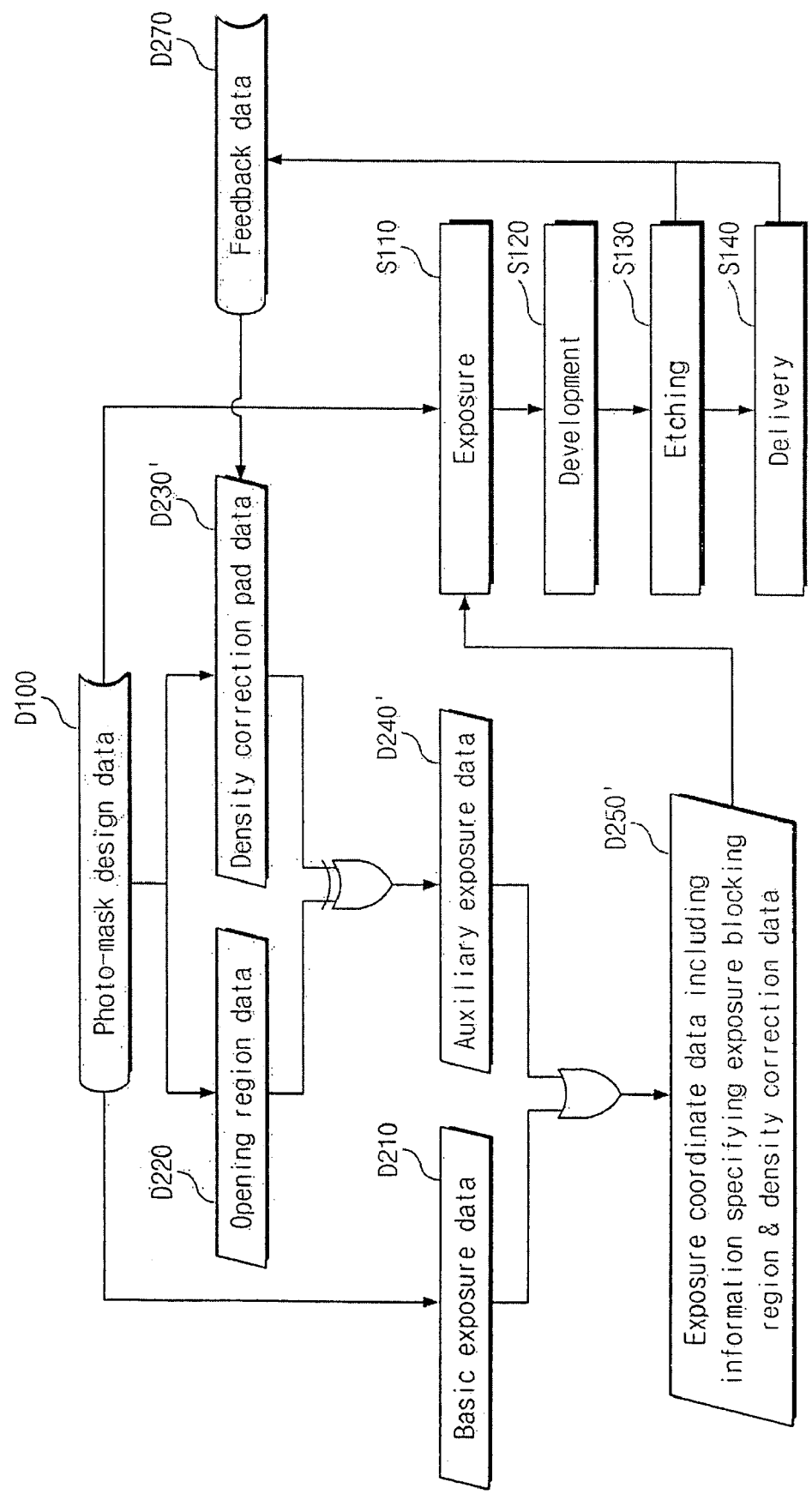
FIG. 8 is a flowchart of another embodiment of the method of fabricating a photo-mask according to the present invention.

FIG. 8 illustrates a second embodiment of a method of fabricating a photo-mask according to the present invention, applicable to the case in which the line width of the main mask pattern tends to vary for indiscernible reasons. Hereinafter, those aspects of the second embodiment of the present invention which differ from the embodiment of FIG. 7 will be described in detail.

Referring to FIG. 8, the variations in the line width (differences between actual line width and design line width) are analyzed to prepare feedback data D270 that can be applied to the exposure process. More specifically, the feedback data D270 is prepared by experimentally analyzing the results of measuring the line width of the main mask pattern. Also, the feedback data D270 may be prepared by experimentally or theoretically analyzing the extent to which the line width of the wafer photoresist pattern tends to differ from the desired line width when the layer of photoresist on the wafer is exposed using the photo-mask 300.

Figure 17:
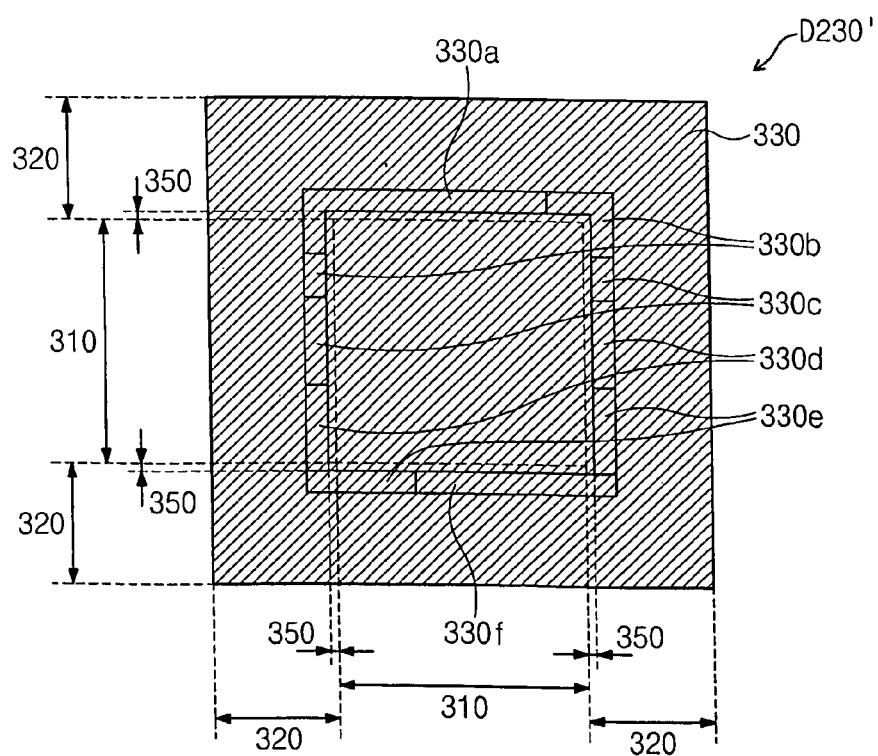
FIG. 17 illustrates the virtual information provided by density correction pad data in the embodiments of FIGS. 8 and 9.

According to the second embodiment of the present invention, the feedback data D270 is used to specify a pattern density of the density correcting pattern 400b (FIG. 15) that will offset those indeterminable effects which would otherwise tend to cause variations in the line width of the main mask pattern. For example, as illustrated in FIGS. 8 and 17, modified density correcting regions 330a-330f having different pattern densities are provided around the main region 310. The pattern densities of the modified density correcting regions 330a-330f are specified by the density correcting pad data D230' to offset the effects on the line width of the main mask pattern.

Figure 18:
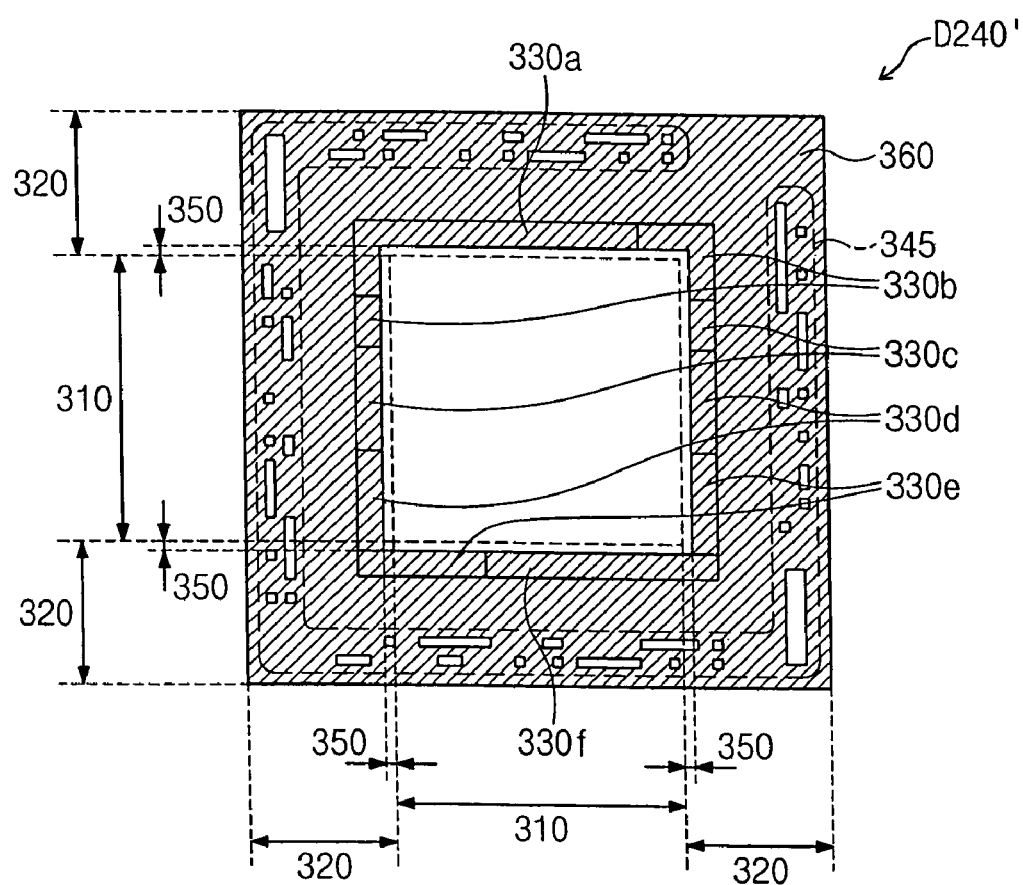
FIG. 18 illustrates the virtual information provided by auxiliary exposure data in the embodiments of FIGS. 8 and 9.
Figure 19:
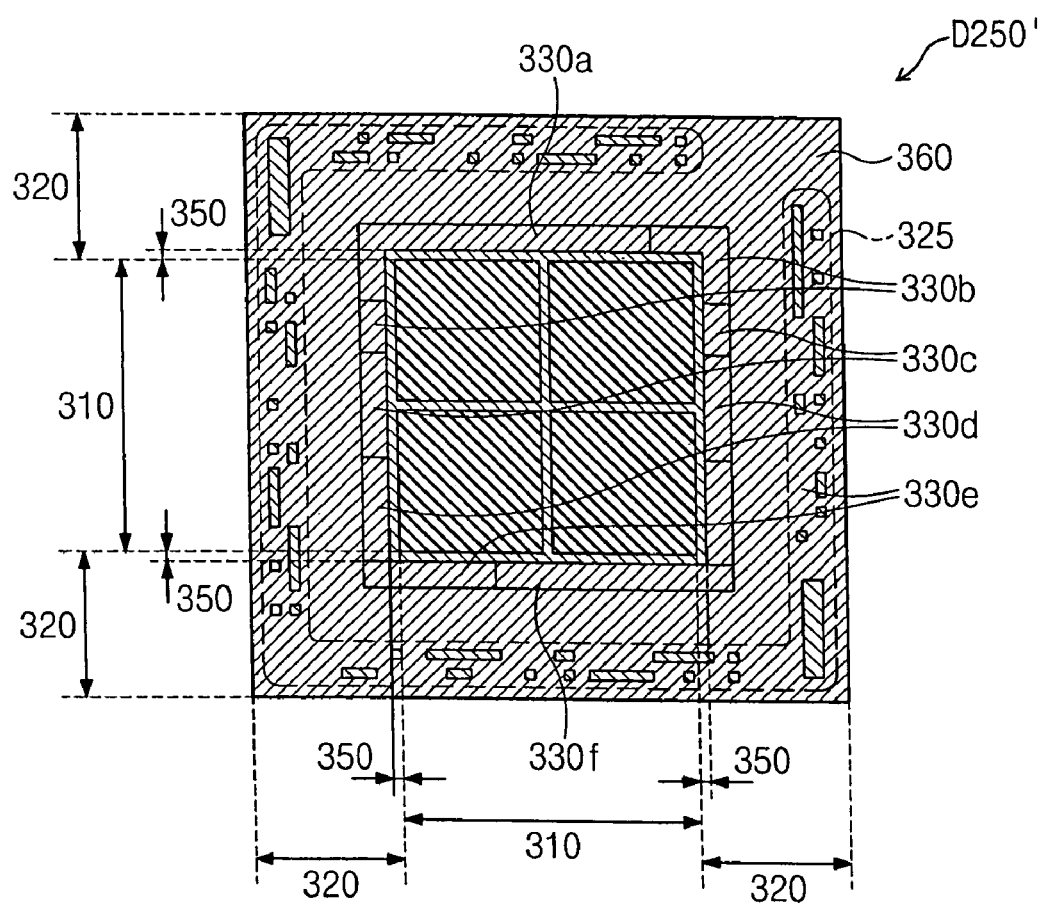
FIG. 19 is a plan view of another embodiment of a photo-mask according to the present invention prepared from data generated by either of the methods of FIGS. 8 and 9.

The density correcting pad data D230', which includes information on the modified density correcting regions 330a-330f, is combined with the opening region data D220 using an exclusive OR operation. As a result, auxiliary exposure data D240' (FIG. 18) that specifies the modified density correcting regions 330a-330f is obtained. Subsequently, the auxiliary exposure data D240' and the basic exposure data D210 are combined using an OR operation to generate exposure coordinate data D250' (FIG. 19) that includes information specifying the modified density correcting regions 330a to 330f.

Figure 9:
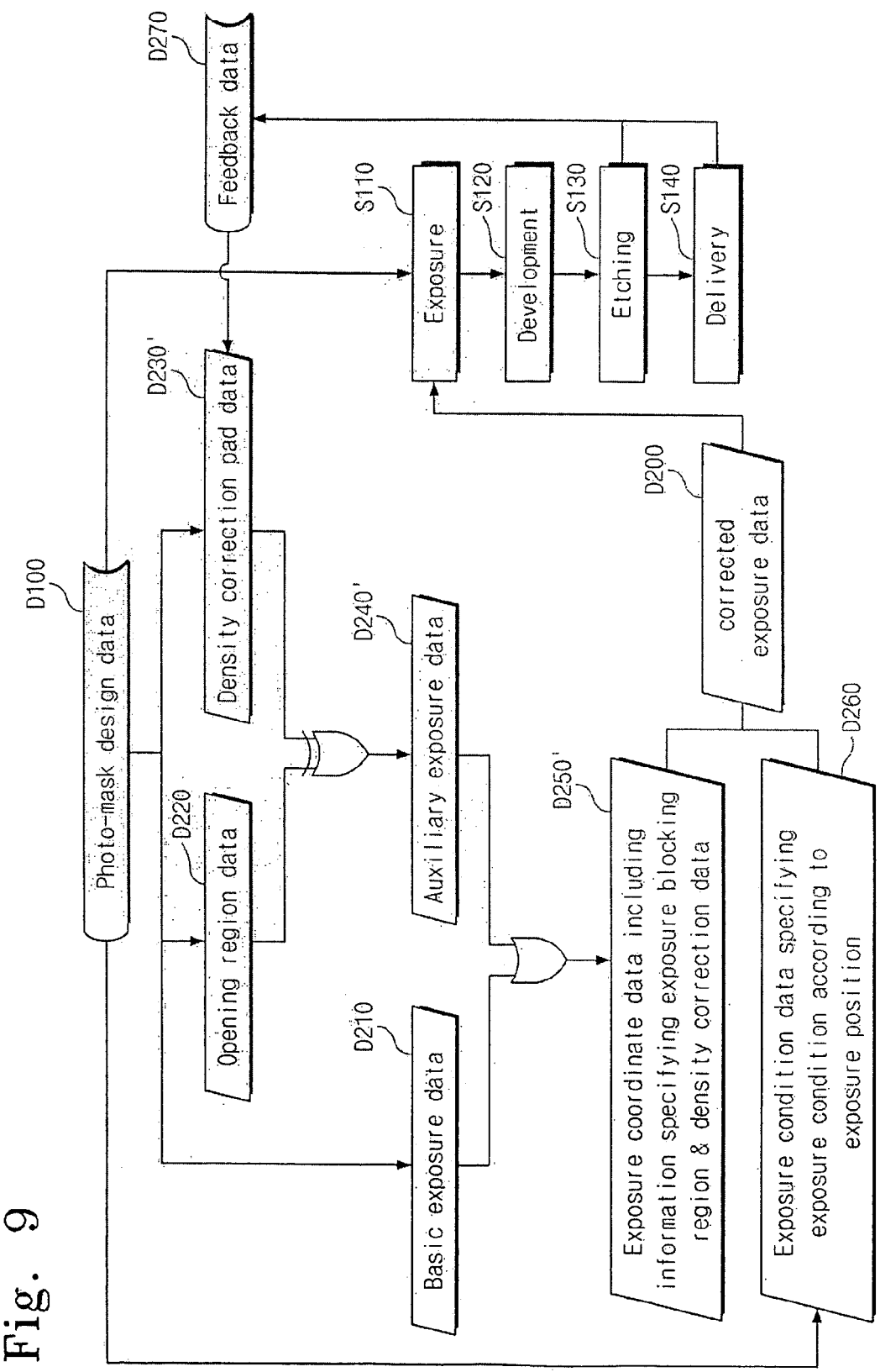
FIG. 9 is a flowchart of yet another of the method of fabricating a photo-mask according to the present invention.

FIG. 9 illustrates a third embodiment of a method of fabricating a photo-mask according to the present invention. Hereinafter, those aspects of the third embodiment of the present invention that differ from the previous embodiments will be described in detail.

The exposure process (S110) entails locally irradiating predetermined regions of the photoresist film. Therefore, this process itself may cause the line width of the pattern to vary from region to region. In view of this, the third embodiment of the present invention comprises controlling the physical state of the radiation used in the exposure process. For example, when an electron beam is used as the source of radiation, the dose of the electron beam is controlled. That is, the exposure process (S110) is performed using the exposure coordinate data D250' that specifies the coordinates of the regions to be irradiated, and exposure condition data D260 that specifies the conditions, e.g., the doses, under which the regions are to be irradiated, respectively (dose in accordance with position). The exposure coordinate data D250' and the exposure condition data D260 constitute corrected exposure data D200.

Figure 21A:
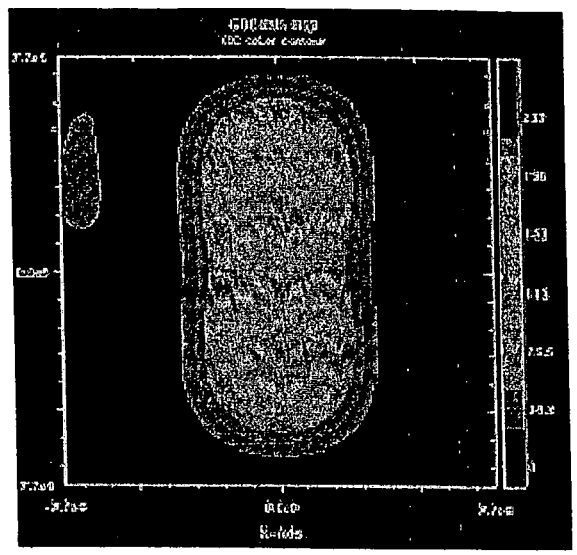
FIGS. 21A and 21B are dose condition maps specifying electron beam dose conditions required when a photo-mask does not have a density correcting pattern and when a photo-mask has a density correcting pattern, respectively.
Figure 21B:
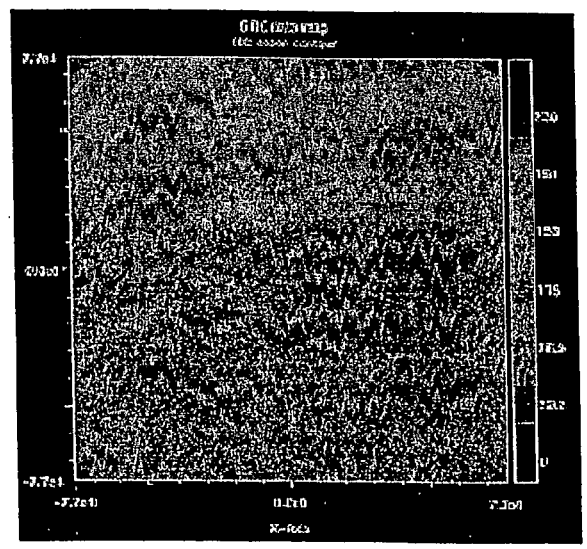

FIGS. 21A and 21B are dose condition maps illustrating doses of the electron beam in accordance with position in the exposure process. FIG. 21A illustrates the doses in the conventional method. FIG. 21B illustrates the doses in the method of the present invention, wherein the photo-mask includes the density correcting region 360. The doses are calculated to offset any dependence between the line width and the position at which the photoresist film is being irradiated.

If the dose of the electron beam were controlled in the process of fabricating a photo-mask having a large amount of non-uniformity in its line width (as illustrated in FIG. 20A), the dose of the electron beam would vary significantly with position (refer to FIG. 21A). In such a case, a region(s) of the photoresist would be irradiated with an electron beam having a dose below the threshold (the dose required to initiate a photochemical reaction with the photoresist). Accordingly, the development process (S120) would fail to remove the photoresist completely from those region(s).

On the other hand, according to the present invention, the main mask pattern 400a has a high degree of uniformity in its line width due to the density correcting region 360. Accordingly, the doses of the irradiation used in the exposure process do not have to vary much with position (refer to FIG. 21B). Therefore, the photoresist will be developed (S120) completely when the photo-mask is fabricated.

Next, a first embodiment of a photo-mask according to the present invention will be described in more detail referring to FIGS. 14 and 15 again. The photo-mask according to the present invention may be fabricated by the methods described in connection with FIGS. 6 and 7.

As was described above, the photo-mask 300 has a main region 310 in which a main mask pattern is disposed, a density correcting region 360 in which a density correcting pattern 400b is disposed, and an exposure blocking region 350 in which the exposure blocking pattern 400 is disposed. The main mask pattern 400a corresponds to the circuit pattern to be formed on a wafer. The exposure blocking region 350 is interposed between the main region 310 and the density correcting region 360 and extends from the main mask pattern 400a to the density correcting pattern 400b. Also, the photo-mask has an auxiliary region 325 in which an auxiliary pattern (s) such as an alignment key is disposed. The exposure blocking region 350, the density correcting region 360 and the auxiliary region 325 make up the peripheral region 320 of the photo-mask, namely the region outside the main region 310.

The mask patterns of the photo-mask 300, namely the main mask pattern 400a, the density correcting pattern 400b, the exposure blocking pattern 400, and the auxiliary pattern(s), are disposed on a transparent mask substrate 420. The photo-mask substrate 420 may be of quartz. The mask patterns may be made of at least one layer of material selected from a group consisting of Cr, MoSi, a group IV-transition metal nitride, a group V-transition metal nitride, a group VI-transition metal nitride, and silicon nitride. For example, the mask patterns may be of a plurality of layers when the photo-mask is a phase shift mask (PSM).

Furthermore, according to the present invention, the exposure blocking pattern 400 occupies the entire area of the exposure blocking region 350. As a result, the pattern density of the exposure blocking region 350 is 100%. On the other hand, the main region 310 and the peripheral region 320 may have pattern density of 30 to 70% and 10 to 90%, respectively.

According to one embodiment of the present invention, the density correcting region 360 has the same pattern density as the main region 310. Also, the exposure blocking region 350 surrounds the main region 310 and has a width of 0.1 to 50 mm.

According to another embodiment of the present invention, the density correcting region 360 has a pattern density that is slightly different from the pattern density of the main region 310. In this embodiment, the density correcting region 360 preferably includes the modified density correcting regions 330a to 330f adjacent the exposure blocking region 350 (refer to FIG. 19). The pattern densities of the modified density correcting regions 330a to 330f are derived to offset the tendency of the line width of the main mask pattern 400a to vary with position. Typically, the pattern densities of the modified density correcting regions 330a to 330f differ from the pattern density of the main region 310 by about 10%.

According to the present invention as described above, a density correcting region having a pattern density similar to the pattern density of the main region extends around the main region. The specifications of the density correcting pattern occupying the density correcting region are derived from basic design data and may be supplemented with feedback to thereby remove the tendency of the line width of the main mask pattern to vary. In particular, at the very least, the fogging and loading effects are obviated. As a result, it is possible to fabricate a photo-mask whose line width has a high degree of uniformity.

Also, according to the present invention, an exposure blocking region is interposed between the main region and the density correcting region to prevent the density correcting pattern from being transcribed to a wafer. Therefore, it is possible to prevent defects from occurring in the products.

Still further, the specifications of the density correcting region and the exposure blocking region may be created by processing design data provided by a product designer. Accordingly, the density correcting region and the exposure blocking region may be formed by the same photolithography/etching processes used to form the main mask pattern, i.e., without the need to perform additional film-forming/patterning processes. As a result, a photo-mask having a line width with a high degree of uniformity may be fabricated at a relatively low cost.

Finally, although the present invention has been described above with respect to the preferred embodiments thereof, the present invention is not so limited. Rather, various changes to and modifications of the disclosed embodiments, as will be apparent to those of ordinary skill in the art, are within the true spirit and scope of the invention as defined by the appended claims.

What is claimed is:

1. A method of fabricating a photo-mask of photolithography equipment for use in transcribing an image onto a wafer, the method comprising:

providing design data that includes specifications of a main mask pattern of the photo-mask, the main mask pattern to be formed in a main region of the photo-mask and having a configuration corresponding to that of a circuit pattern to be formed on the wafer;

deriving exposure data using the design data, wherein the exposure data comprises information that includes specifications of a density correcting pattern to be formed within a peripheral region of the photo-mask outside the main region, and an exposure blocking pattern to be formed in an exposure blocking region of the photo-mask that extends from the main mask pattern to the density correcting pattern; and processing a photo-mask substrate using the exposure data to simultaneously form the main mask pattern in the main region of the photo-mask, the density correcting pattern in the peripheral region of the photo-mask, and the exposure blocking pattern in the exposure blocking region of the photo-mask.

2. The method as set forth in claim 1, wherein the pattern density of that portion of the peripheral region occupied by the density correcting pattern being similar to the pattern density of the main region.

3. The method as set forth in claim 1, wherein the exposure blocking region has a pattern density sufficient to prevent the image of the density correcting pattern from being transmitted by the photo-mask when the photo-mask is illuminated by radiation from an exposure light source of the photolithography equipment.

4. The method as set forth in claim 1, wherein the photo-mask substrate has a mask layer and a photoresist layer disposed thereon with the photoresist layer overlying the mask layer, and the processing of the photo-mask substrate comprises:

performing an exposure process in which the photoresist layer is exposed, wherein the exposure process is controlled using the exposure data;

subsequently developing the photoresist layer, whereby the photoresist layer is patterned; and etching the mask layer using the patterned photoresist layer as an etch mask to form the main mask pattern in the main region of the photo-mask, the density correcting pattern in the peripheral region of the photo-mask, and the exposure blocking pattern in the exposure blocking region.

5. The method as set forth in claim 1, wherein the providing of the design data comprises providing data that includes specifications of an auxiliary pattern to be formed in an auxiliary region located within the peripheral region of the photo-mask, and wherein the deriving of the exposure data comprises:

generating opening region data specifying relative locations of the main region, exposure blocking region, and auxiliary region, and using the opening region data to specify that the density correcting pattern is to extend around the main region, and is to be excluded from the exposure blocking region and the auxiliary region.

6. The method as set forth in claim 1, wherein the deriving of the exposure data comprises:

preparing, from the design data, basic exposure data that specifies coordinates of the main mask pattern, preparing auxiliary exposure data that specifies coordinates of the density correcting pattern, and combining the basic exposure data and the auxiliary exposure data to create exposure coordinate data.

7. The method as set forth in claim 6, wherein the preparing of the auxiliary exposure data comprises:

preparing, from the design data, opening region data that includes specifications of a region of the photo-mask from which the density correcting pattern is to be excluded, preparing density correcting pad data that includes specifications of a density correcting pad pattern for a pad region corresponding to the entire surface of the photo-mask, and logically processing the opening region data and the density correcting pad data.

8. The method as set forth in claim 7, wherein the providing of the design data comprises providing data that includes specifications of an auxiliary pattern to be formed in an auxiliary region located within the peripheral region of the photo-mask, and wherein the preparing of the opening region data comprises:

extracting, from the design data, data of the coordinates of a main opening region of the photo-mask, the main opening region including the main region and the exposure blocking region, extracting, from the design data, data of the coordinates of an auxiliary opening region occupied by the auxiliary pattern, and combining the data of the coordinates of the main opening region and the data of the coordinates of the auxiliary opening region using an OR operation.

9. The method as set forth in claim 7, wherein the logical processing of the opening region data and the density correcting pad data comprises executing an exclusive OR logic operation.

10. The method as set forth in claim 7, wherein the preparing of the density correcting pad data comprises setting the pattern density of the region of the density correcting pad to be the same as the pattern density of the main region.

11. The method as set forth in claim 7, wherein the preparing of the density correcting pad data comprises using feedback, obtained experimentally or theoretically, to specify the pattern density of the pad region in accordance with position.

12. The method as set forth in claim 6, wherein the combining of the basic exposure data and the auxiliary exposure data comprises executing an exclusive OR logic operation.

13. The method as set forth in claim 6, wherein the exposure process comprises exposing the photoresist layer locally, and wherein the deriving of the exposure data further comprises:

preparing exposure condition data that specifies conditions of the exposure process as a function of the positions at which the photoresist layer is to be exposed during the exposure process, and combining the exposure condition data and the exposure coordinate data.

14. The method as set forth in claim 13, wherein the exposure process is performed using an electron beam or a laser, and wherein the exposure condition data comprises data that specifies a physical property of the electron beam or laser as a function of position.

15. The method as set forth in claim 1, wherein the deriving of the exposure data comprises setting that portion of the peripheral region occupied by the density correcting pattern to be equal to the pattern density of the main region.

16. The method as set forth in claim 1, wherein the deriving of the exposure data comprises specifying a pattern density, of that portion of the peripheral region occupied by the density correcting pattern, that varies in accordance with position.

17. A method of fabricating a photo-mask, comprising:
providing design data that specifies a main mask pattern and an auxiliary pattern of the photo-mask, the main mask pattern to be formed in a main region and the auxiliary pattern to be formed in an auxiliary region of the photo-mask;
extracting basic exposure data, that specifies coordinates of the main mask pattern and the auxiliary pattern, from the design data;
preparing, using the design data, density correcting pad data that includes specifications of a density correcting pad pattern for a pad region corresponding to the entire surface of the photo-mask;
preparing, using the design data, opening region data that specifies coordinates of a region of the photo-mask from which the density correcting pad pattern is to be excluded;
combining the density correcting pad data and the opening region data using an exclusive OR logic operation to generate auxiliary exposure data that includes information representing coordinates of a density correcting pattern;
combining the basic exposure data and the auxiliary exposure data using an OR logic operation to generate exposure coordinate data;
providing a photo-mask substrate on which a mask layer and a photoresist layer are disposed with the photoresist layer overlying the mask layer;
performing an exposure process in which the photoresist layer is exposed, wherein the exposure process is controlled using data which includes the exposure coordinate data;
subsequently developing the photoresist layer, whereby the photoresist layer is patterned; and
etching the mask layer using the patterned photoresist layer as an etch mask to simultaneously form the main mask pattern in the main region of the photomask at coordinates provided by the basic exposure data, the auxiliary pattern in the auxiliary region of the photo-mask at coordinates provided by the basic exposure data, and the density correcting pattern in a region established by the coordinates provided by the auxiliary exposure data.

18. The method as set forth in claim 17, wherein the preparing of the density correcting pad data further comprises using feedback, obtained experimentally or theoretically, to specify the pattern density of the pad region in accordance with position.

19. The method as set forth in claim 17, wherein the step of preparing the opening region data comprises the steps of:
extracting, from the design data, data of coordinates of a main opening region comprising the main region and an exposure blocking region that surrounds the main region,
extracting, from the design data, data of coordinates of an auxiliary opening region within the auxiliary region, and
combining the data of the coordinates of the main opening region and the data of the coordinates of the auxiliary opening region using an OR logic operation.

20. The method as set forth in claim 17, wherein the exposure process comprises exposing the photoresist layer locally, and
further comprising generating the data used to control the exposure process by:
preparing exposure condition data that specifies conditions of the exposure process as a function of the positions at which the photoresist layer is to be exposed during the exposure process, and
combining the exposure condition data and the exposure coordinate data.

21. A photo-mask comprising:
a transparent photo-mask substrate having a main region, and a peripheral located outside the main region, the peripheral region including an exposure blocking region;
a main mask pattern in the main region of the photo-mask substrate, and corresponding to a circuit pattern to be formed on wafer;
a density correcting pattern in the peripheral region of the photo-mask substrate outside the exposure blocking region, the pattern density of that portion of the peripheral region occupied by the density correcting pattern being similar to the pattern density of the main region; and
an exposure blocking pattern in the exposure blocking region,
wherein the exposure blocking region extends from the main mask pattern in the main region to the density correcting pattern in the peripheral region, and has a pattern density sufficient to prevent the image of the density correcting pattern from being transmitted by the photo-mask when the photo-mask is illuminated by radiation from an exposure light source of photolithography equipments,
wherein the exposure blocking pattern and the main mask pattern are made of substantially the same material.

22. The photo-mask as set forth in claim 21, wherein the pattern density of the main region is 30 to 70%, and
the pattern density of the peripheral region is 10 to 90%.

23. The photo-mask as set forth in claim 22, wherein the pattern density of that portion of the peripheral region occupied by the density correcting pattern is equal to the pattern density of the main region.

24. The photo-mask as set forth in claim 22, wherein the peripheral region comprises modified density correcting regions adjacent to the exposure blocking region, and
wherein the density correcting pattern comprises modified density correcting patterns disposed in the modified density correcting regions, respectively, the modified density correcting regions having different pattern densities.

25. The photo-mask as set forth in claim 24, wherein the pattern densities of the modified density correcting regions each differ from the pattern density of the main region by about 10%.

26. The photo-mask as set forth in claim 21, wherein the exposure blocking region has a width of 0.1 to 50 mm and surrounds the main region.

27. The photo-mask as set forth in claim 21, wherein the exposure blocking pattern, the main mask pattern and the density correcting pattern are of the same material and have the same thickness.

28. A method of generating data for use in controlling the process of exposing a photoresist layer in the fabricating of a photo-mask, the method comprising:
providing design data that specifies a main mask pattern of the photo-mask, and an auxiliary pattern of the photo-mask, the main mask pattern to be formed in a main region of the photo-mask and having a configuration corresponding to that of a circuit pattern, and the auxiliary pattern to be formed in an auxiliary region of the photo-mask;

deriving exposure data using the design data, wherein the exposure data comprises information that specifies a density correcting pattern to be formed within a peripheral region of the mask outside the main region, and an exposure blocking pattern to be formed in an exposure blocking region of the photo-mask, the pattern density of that portion of the peripheral region occupied by the density correcting pattern being similar to the pattern density of the main region, the exposure blocking region extending from the main mask pattern to the density correcting pattern, and the exposure blocking region having a pattern density sufficient to prevent the image of the density correcting pattern from being transmitted by the photo-mask when the photo-mask is illuminated by radiation from an exposure light source of photolithography equipment.

29. The method as set forth in claim 28, wherein the deriving of the exposure data comprises:
generating opening region data specifying relative locations of the main region, exposure blocking region, and auxiliary region, and
using the opening region data to specify that the density correcting pattern is to extend around the main region, and is to be excluded from the exposure blocking region and the auxiliary region.

30. The method as set forth in claim 28, wherein the deriving of the exposure data comprises:
preparing, from the design data, opening region data that specifies a region of the photo-mask from which the density correcting pattern is to be excluded,
preparing density correcting pad data that specifies a density correcting pad pattern for a pad region corresponding to the entire surface of the photo-mask, and
logically processing the opening region data and the density correcting pad data to generate auxiliary exposure data.

31. The method as set forth in claim 30, wherein the preparing of the density correcting pad data comprises using feedback, obtained experimentally or theoretically, to specify the pattern density of the pad region in accordance with position.

32. The method as set forth in claim 28, wherein the deriving of the exposure data further comprises:
preparing exposure condition data that specifies conditions of the exposure process as a function of the positions at which the photoresist layer is to be exposed during the exposure process, and
combining the exposure condition data and the exposure coordinate data.

33. The method as set forth in claim 32, wherein the exposure condition data comprises data that specifies a physical property of an electron beam or laser, to be used in the exposure process, as a function of position.

34. A method of generating data for use in controlling the process of exposing a photoresist layer in the fabricating of a photo-mask, comprising:
providing design data that specifies a main mask pattern and an auxiliary pattern of the photo-mask, the main mask pattern to be formed in a main region and the auxiliary pattern to be formed in an auxiliary region of the photo-mask;
extracting basic exposure data, that specifies coordinates of the main mask pattern and the auxiliary pattern, from the design data;
preparing, using the design data, density correcting pad data that specifies a density correcting pad pattern for a pad region corresponding to the entire surface of the photo-mask;
preparing, using the design data, opening region data that specifies coordinates of a region of the photo-mask from which the density correcting pad pattern is to be excluded;
combining the density correcting pad data and the opening region data using an exclusive OR operation to generate auxiliary exposure data that includes information representing coordinates of a density correcting pattern; and
combining the basic exposure data and the auxiliary exposure data using an OR operation to generate exposure coordinate data.

35. The method as set forth in claim 34, wherein the preparing of the density correcting pad data further comprises using feedback, obtained experimentally or theoretically, to specify the pattern density of the pad region in accordance with position.

36. The method as set forth in claim 34, wherein the step of preparing the opening region data comprises the steps of:
extracting, from the design data, data of coordinates of a main opening region comprising the main region and an exposure blocking region that surrounds the main region,
extracting, from the design data, data of coordinates of an auxiliary opening region within the auxiliary region, and
combining the data of the coordinates of the main opening region and the data of the coordinates of the auxiliary opening region using an OR operation.

37. The method as set forth in claim 34, and further comprising:
preparing exposure condition data that specifies conditions of the exposure process as a function of the positions at which the photoresist layer is to be exposed during the exposure process, and
combining the exposure condition data and the exposure coordinate data.

* * * * *